Dec. 15, 1959 E. W. PLESSER 2,916,805

METHOD OF SECURING ELECTRICAL CONNECTIONS TO PRINTED WIRING PANELS

Filed Aug. 9, 1955 2 Sheets-Sheet 1

Inventor:
Edgar W. Plesser by Howson & Howson
Attys.

Dec. 15, 1959 E. W. PLESSER 2,916,805

METHOD OF SECURING ELECTRICAL CONNECTIONS TO PRINTED WIRING PANELS

Filed Aug. 9, 1955 2 Sheets-Sheet 2

Inventor:
Edgar W. Plesser
by Howson & Howson
Attys.

United States Patent Office 2,916,805

Patented Dec. 15, 1959

2,916,805

METHOD OF SECURING ELECTRICAL CONNECTIONS TO PRINTED WIRING PANELS

Edgar W. Plesser, Glenside, Pa., assignor to Philco Corporation, Philadelphia, Pa., a corporation of Pennsylvania Application August 9, 1955, Serial No. 527,274

3 Claims. (Cl. 29—155.5)

Figure 3:
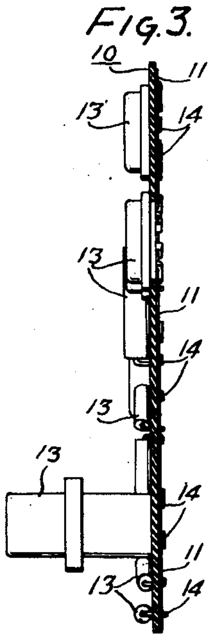

The invention hereinafter described and claimed relates to electrical apparatus, being especially concerned with the making of electrical connections between circuit components and the relatively flat, ribbon-like conductors which characterize circuits of the so-called "printed" type. In such circuits the various components of the equipment—which may, for example, take the form of radio or television receiving equipment—are interconnected by conductive strips affixed directly to a mounting panel in accordance with a predetermined circuit diagram, and it is the primary object of my invention to provide an improved method for making the necessary soldered connections between the component leads and the terminal points of the conductive strips which define the circuit pattern.

Printed circuits, per se, are well-known, having been applied to mounting panels in a variety of different ways, and having gone into wide commercial use. At an early stage in the development of this art the lead wires extending from the components were held, mechanically, in juxtaposition to terminal portions of the printed circuitry, and the necessary electrical connections were made by soldering the lead wires, individually, to the said terminal portions. As will be appreciated, this technique is both laborious and expensive and, to a large extent, has been superseded by a method in which all of the terminal connections are made simultaneously by dipping the panel (the lead wires first having been temporarily secured in place, as for example by crimping) into a bath of molten solder.

The dipping procedure is subject to certain difficulties and disadvantages, one difficulty having been that the heat of the solder bath tends to cause portions of the strip-like conductive pattern to blister and stand away from the mounting panel. Another problem has been that solder adhered to portions of the printed wiring pattern removed from the regions where solder connections were desired. There was also a tendency for solder to bridge the gap between closely spaced conductors. Random adherence has not only resulted in wastage of solder, but also has impaired both the appearance and the electrical characteristics of the printed circuit, while bridging results, of course, in short circuits.

In general, it is the broad objective of the present invention to provide a soldering method or procedure which may be utilized rapidly, reliably, and inexpensively, without encountering any of the difficulties and disadvantages inherent in prior procedures.

More particularly my invention has as an object the elimination of problems resulting from deposition of solder on portions of the panel other than the terminal portions to which it is desired to connect leads and the like, the invention being featured by the fact that this objective is achieved without blistering of the conductive ribbon.

In another aspect of the invention it is an object to provide a novel and improved circuit panel assembly which is peculiarly well adapted for soldering by the dipping technique.

To the foregoing general ends, my invention provides a novel procedure of remarkable simplicity, in accordance with which the panel structure to be soldered is masked during the soldering operation by a flexible mask of low heat conductivity provided with predetermined window areas or the like overlying the points where solder connections are desired. The masking is effective to prevent destructive heating of the panel and its associated circuits, and to insure that the deposition of solder is limited to those regions in which it is desired to make connections.

Figure 1:
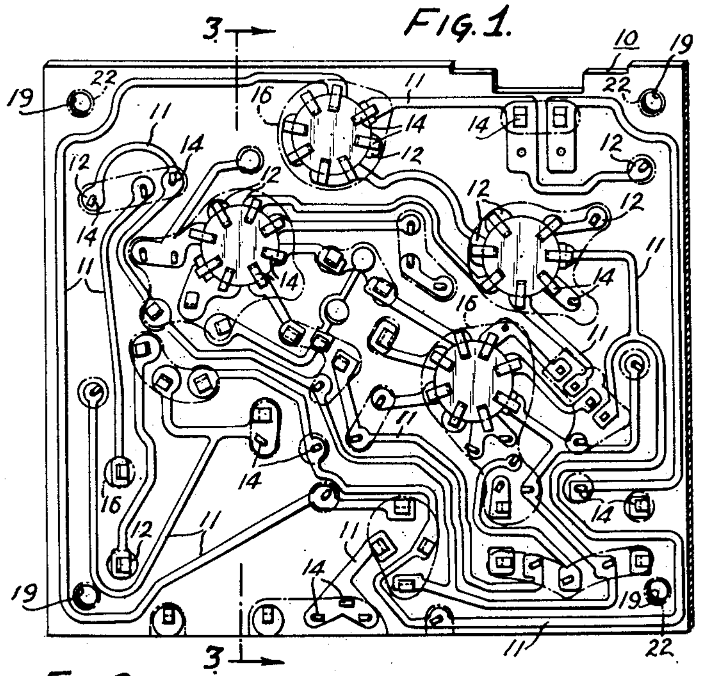
Figure 4:
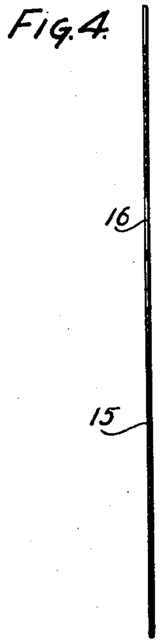
Figure 2:
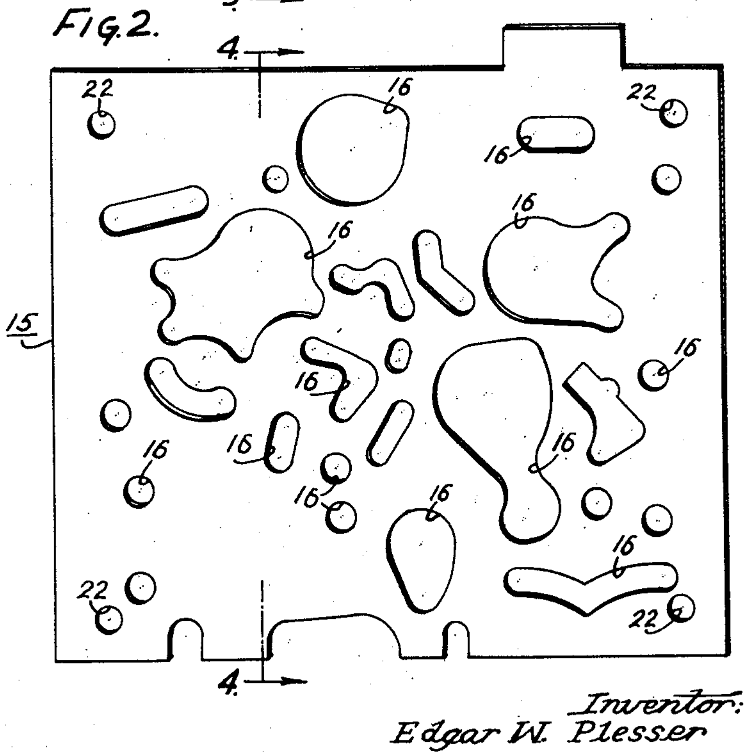
Figure 5:
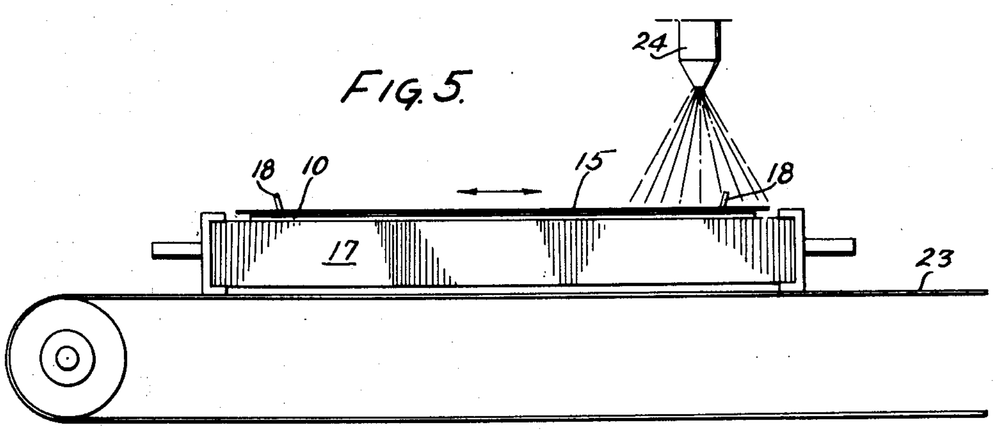
Figure 6:
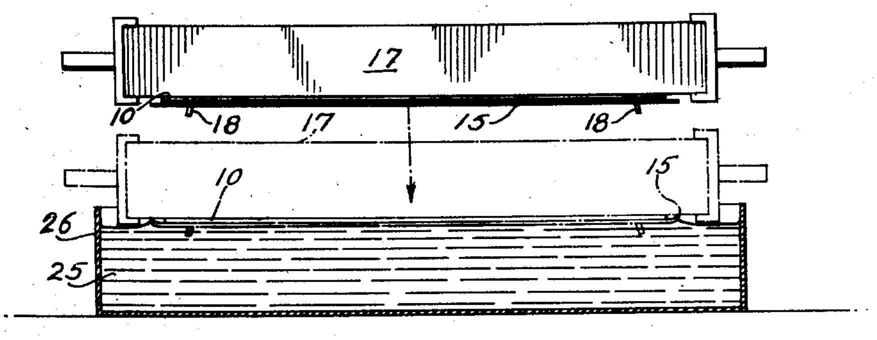
Figure 7:
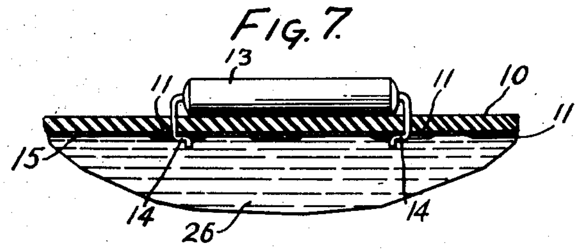
Figure 8:
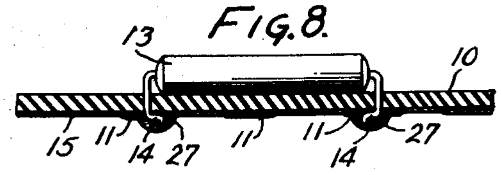

Still further objects and features of the invention, and the manner in which they have been attained, will be evident from reading of the following detailed description in the light of the attached drawing, in which, Figure 1 is a face view of a printed wiring panel with the terminal connections crimped in place prior to the soldering operation, Figure 2 is a mask designed and manufactured for application to the face of the panel of Figure 1, in performance of the soldering operation, Figure 3 is a cross-section on the line 3—3 of Figure 1, Figure 4 is a cross-section on the line 4—4 of Figure 2, Figure 5 is a somewhat schematic side elevation showing the performance of a step preliminary to soldering, after application of the mask of Figures 2 and 4, Figure 6 is a similar view illustrating the next step of the process, Figure 7 is a detailed cross-section through a component and a part of the panel at the time of soldering, and Figure 8 is a view corresponding to Figure 7, illustrating the same parts after completion of the soldering operation.

As illustrated in Figures 1 and 2, the panel 10 may be formed of suitable insulating material, such as a synthetic resin, and the printed wiring pattern, including thin flat conductor strips 11 and terminals 12, may be applied to the face of the panel by any known method, as for example by etching, by electrodeposition, or the like. The components 13 are affixed to the rear or opposite side of the panel by passing their wiring leads through holes in the panel and crimping them against the printed pattern terminal connections 12, as indicated at 14. It has heretofore been the practice in the art to dip such panels, with the components and terminal connections affixed as illustrated, into a soldering bath with the panel face contacting the upper surface of the molten solder, in order to solder the crimped lead ends 14 in place. In the practice of the present invention, this step is performed in such manner as to insure consistent and predictable results in this soldering operation, while avoiding all chance of damage to the printed pattern.

The protective features of the invention are obtained by the use of a special mask 15, which is temporarily affixed in superposed relation over the face of the panel containing the wiring pattern as discussed below, prior to soldering, and removed after the soldering is completed. This mask is provided with holes 16 providing the aforementioned predetermined window areas, which, when the mask is superimposed over the face of the panel, overlie and surround the terminal positions 12 at which it is desired to apply the solder; i.e., the areas at which the lead wires are crimped against circuit terminals, while the imperforate part of the mask covers and protects the remaining portions of the face. As indicated above, the mask is made of material which is a good heat insulator and which is also flexible, with the result that the printed strips or conductors of copper or the like are protected against the high heat of the soldering bath.

If the mask were to be made of rigid material, it would be impossible to apply it to a panel of synthetic resin or the like, as aforesaid, in such a way as to protect the face of the panel, except perhaps by adhesively securing the mask to the panel throughout, or by the use of a special sealant at the edges of the holes. The application of such expedients would be time consuming and expensive, and still perhaps not entirely satisfactory. In practice of this invention, I avoid these complications and drawbacks altogether, by a masking technique of remarkable simplicity. I form my mask of flexible material, such as paper, which is applied over the printed face loosely, without any attempt to seal it to the face of the panel around the hole locations. It may be temporarily affixed by securing the mask and panel together at spaced locations along their superposed edges by adhesive tape, but is preferably affixed by a still simpler method as illustrated in Figures 5 and 6. As there illustrated, the panel is secured upon the fixture 17 on which it is mounted for treatment in the dip soldering bath, and this fixture is provided with studs 18 projecting upwardly through holes 19 in the face of the panel and through holes 22 in the mask. The panel is secured to the fixture with the studs 18 projecting through the holes 19, and the mask is then loosely slipped over the face of the panel with its holes 22 also receiving the studs, and thus assuring the desired accurate superposition.

A suitable soldering flux may next be sprayed upon the surfaces to be soldered by reciprocation of the masked panel upon conveyor 23 under a spray gun or nozzle 24 as illustrated in Figure 5, and the fixture 17 is then inverted and applied by dipping, mask and face side down, against the upper surface of a bath of molten solder. As illustrated in Figures 5 and 6, the edges of the flexible mask 15 preferably extend beyond the sides of the panel 10, and these edges bend upwardly, as illustrated in broken lines in Figure 6, thereby preventing solder from entering between the outer edges of the panel and mask.

It should be noted that there is a problem of sealing, not only around the outer edges, but also at each hole location. This problem is solved with the utmost simplicity by the flexibility of the mask. When the mask is brought into contact with the solder there is exerted upon the mask a supporting or buoyant force, due to the greater density of the solder as compared to the mask. As the parts move from the full line to the broken line position of Figure 6, the weight of the panel 10 and fixture 17, as the under side of mask 15 comes to rest upon the surface of the solder 25 in container 26, will cause the fixture and panel to continue to descend, while the mask will float upon the upper surface of the solder bath. By the time the fixture and panel have descended to their lowermost point, as illustrated in Figure 7 and in broken lines in Figure 6, to effect soldering at the desired locations, the flexible mask is pressed firmly against the panel around each of the holes 16, with the result that the soldering is selective, and performed only at the desired locations, as illustrated at 27 in Figure 8.

Upon removal of the fixture with the attached panel and applied mask and solder from the soldering bath, the mask may be simply slipped or peeled off, and the panel removed from the fixture and replaced by the next one in line for the next soldering operation.

From the foregoing discussion, I believe it will be evident that the objects of the invention have been fully attained. The use of the flexible, heat-insulating, mask protects the panel while permitting use of high melting point solders which congeal rapidly, and it permits the masking to be accomplished on a high speed production line basis, since both the application of the mask and its removal are accomplished rapidly, while still providing adequate sealing of the solder window areas 16 against the masked areas to be protected from adhesion of and heating by the solder.

While the invention has been described specifically in relation to a single specific embodiment, persons skilled in the art will be aware that it may be refined or modified in various ways. We therefore wish it to be understood that this invention is not to be limited in interpretation except by the scope of the following claims.

I claim:

1. A method of connecting electrical components to a panel, laminated with conductive circuit paths, and with component leads extending through panel apertures, said method comprising the steps of: providing a solder mask of heat insulating, sheet-like material, sufficiently thin and flexible to sag under its own weight when marginally supported, with mask openings approximately coincident with panel areas including portions of said paths and also including said panel apertures; loosely inserting the component leads from one side of the panel into and through the panel apertures so that lead portions extend adjacent said portions of said paths; loosely securing marginal points of the mask to the panel, with the mask on the other side of the panel, to register the mask openings with the panel apertures and said portions of said paths; thereafter briefly dipping the laminated panel, with the mask presented downwardly, against the upper surface of a bath of molten solder; then promptly removing the laminated panel, with the mask, from the bath so that solder, adherent to said lead portions and to adjacent portions of said paths, congeals, thereby electrically connecting and mechanically securing the components to the panel; and finally removing the mask from the panel.

2. A method of connecting electrical components to a panel, laminated with conductive circuit paths, and with component leads extending through panel apertures, said method comprising the steps of: providing a solder mask of heat insulating, sheet-like material sufficiently thin and flexible to sag under its own weight when marginally supported, with mask openings approximately coincident with panel areas which include and surround said panel apertures; loosely inserting the component leads from one side of the panel into the panel apertures so that, on the other side of the panel, short ends of the leads extend over adjacent panel surface portions, containing elements of said paths; loosely securing marginal points of the mask to said panel, with the mask on the other side of the panel, so that the mask openings substantially register with the panel apertures and adjacent panel surface portions and path elements and that the sheet-like flexible material overlies the panel areas other than said panel surface portions; thereafter momentarily dipping the panel, with the mask presented downwardly, against the upper surface of a bath of molten solder, so that said surface portions are contacted with such solder, to electrically connect and mechanically secure said ends of the leads to said panel surface portions when the solder, adherent to said ends and adjacent surface portions, congeals thereupon promptly removing the panel, with the mask, from the bath, whereby, during said congealing, the laminated panel is protected from the heat of the solder not only by the heat insulating material of the mask but also, pursuant to removal from the bath, by the sagging of the mask and the consequent removal of heat from close adjacency to the panel; and thereafter removing the mask from the panel.

3. A method as described in claim 2, wherein the step of loosely inserting the component leads precedes the step of loosely securing the mask.

References Cited in the file of this patent

UNITED STATES PATENTS

| | | |
|---|---|---|
| 2,506,047 | Thomas | May 2, 1950 |
| 2,616,994 | Luhn | Nov. 4, 1952 |
| 2,649,513 | Luhn | Aug. 18, 1953 |
| 2,695,351 | Beck | Nov. 23, 1954 |
| 2,740,193 | Pessel | Apr. 3, 1956 |